United States Patent
Khayrallah et al.

[11] Patent Number: 5,920,597
[45] Date of Patent: Jul. 6, 1999

[54] DECODING TECHNIQUE FOR TAIL BITING CODES

[75] Inventors: Ali S. Khayrallah, Apex; Amer Hassan, Cary, both of N.C.

[73] Assignee: Ericsson Inc., Stockholm, Sweden

[21] Appl. No.: 08/714,684

[22] Filed: Sep. 16, 1996

[51] Int. Cl.$^6$ ............................... H04L 23/02; H04L 5/12
[52] U.S. Cl. .......................................... 375/265; 371/43.4
[58] Field of Search .................................. 371/8, 9, 37.6, 371/37.4, 41, 69.1, 70, 67.1, 36, 43.4, 43.6, 43.7; 375/265, 262, 285, 254, 296, 341, 261, 340

[56] References Cited

U.S. PATENT DOCUMENTS

| | | | |
|---|---|---|---|
| 4,715,037 | 12/1987 | Yagi | 371/43 |
| 5,115,438 | 5/1992 | Friederichs et al. | 371/43 |
| 5,239,557 | 8/1993 | Dent | 375/200 |
| 5,349,589 | 9/1994 | Chennakeshu et al. | |
| 5,461,632 | 10/1995 | Lomp et al. | 371/43 |
| 5,588,028 | 12/1996 | Parizhshy | 375/341 |
| 5,654,986 | 8/1997 | Lim | 375/341 |
| 5,659,578 | 8/1997 | Alamouti et al. | 375/261 |
| 5,666,370 | 9/1997 | Ganesan et al. | 371/37.01 |
| 5,687,188 | 11/1997 | Feeney et al. | 375/220 |

FOREIGN PATENT DOCUMENTS

| | | |
|---|---|---|
| 0 571 350 | 11/1993 | European Pat. Off. . |
| 0 611 098 | 8/1994 | European Pat. Off. . |

OTHER PUBLICATIONS

IEEE Transactions on Communications, vol. 37, No. 8, Aug. 1989, pp. 875–879, XP000047627 Qiang Wang et al: "An Efficient Maximum Likelihood Decoding Algorithm for Generalized Tail Biting Convolutional Codes Including Quasicyclic Codes".

Primary Examiner—Jason Chan
Assistant Examiner—Jean B. Corrielus
Attorney, Agent, or Firm—Burns, Doane, Swecker & Mathis, L.L.P.

[57] ABSTRACT

A method for decoding encoded digital data. A decoder generates a replicated decoding trellis and performs some number $D^{max}$ of decoding operations using the replicated trellis. Each decoding pass is offset by some amount $\delta$, and the results of each pass are stored and compared with prior results to generate a final output information sequence.

25 Claims, 5 Drawing Sheets

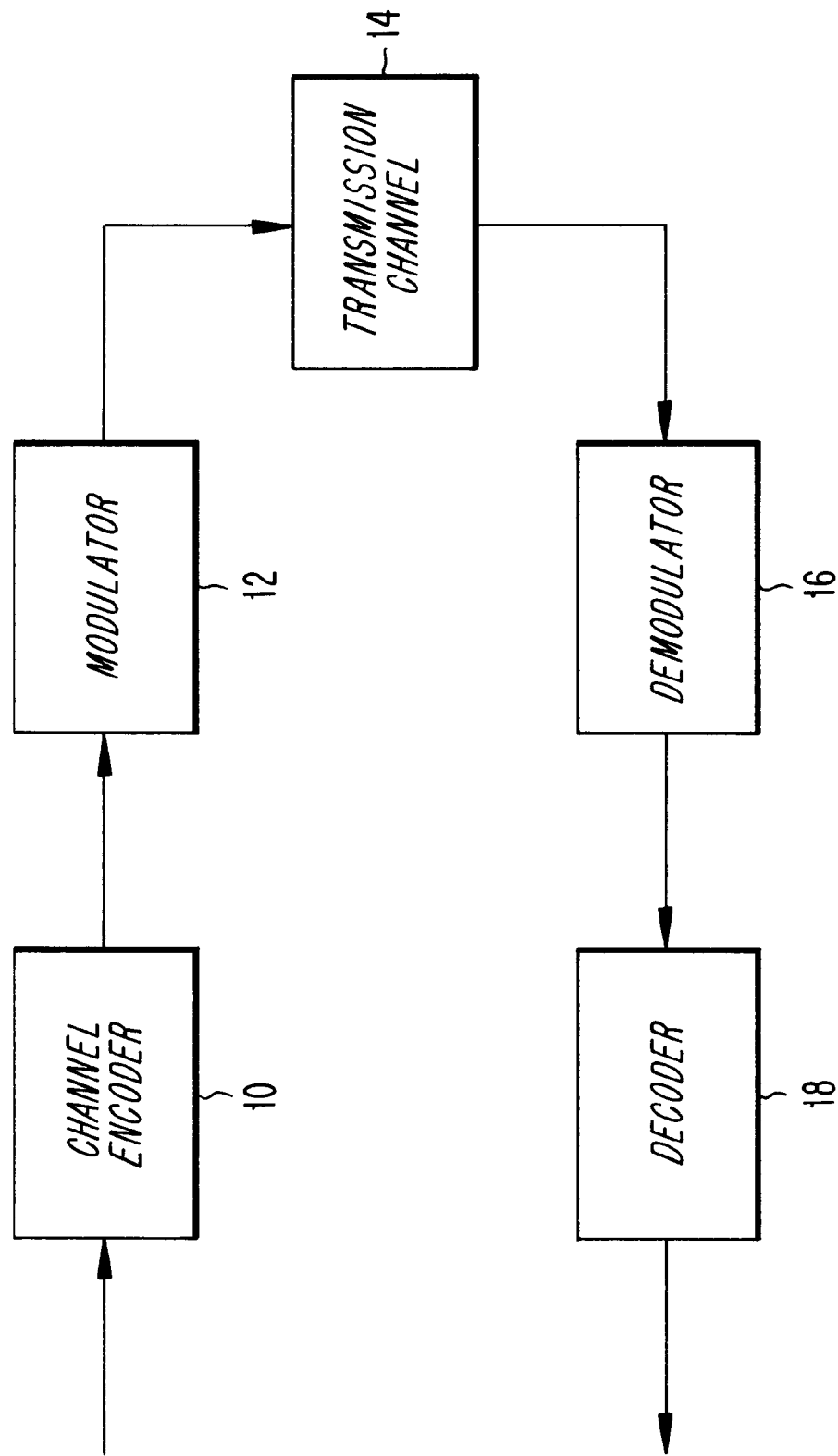

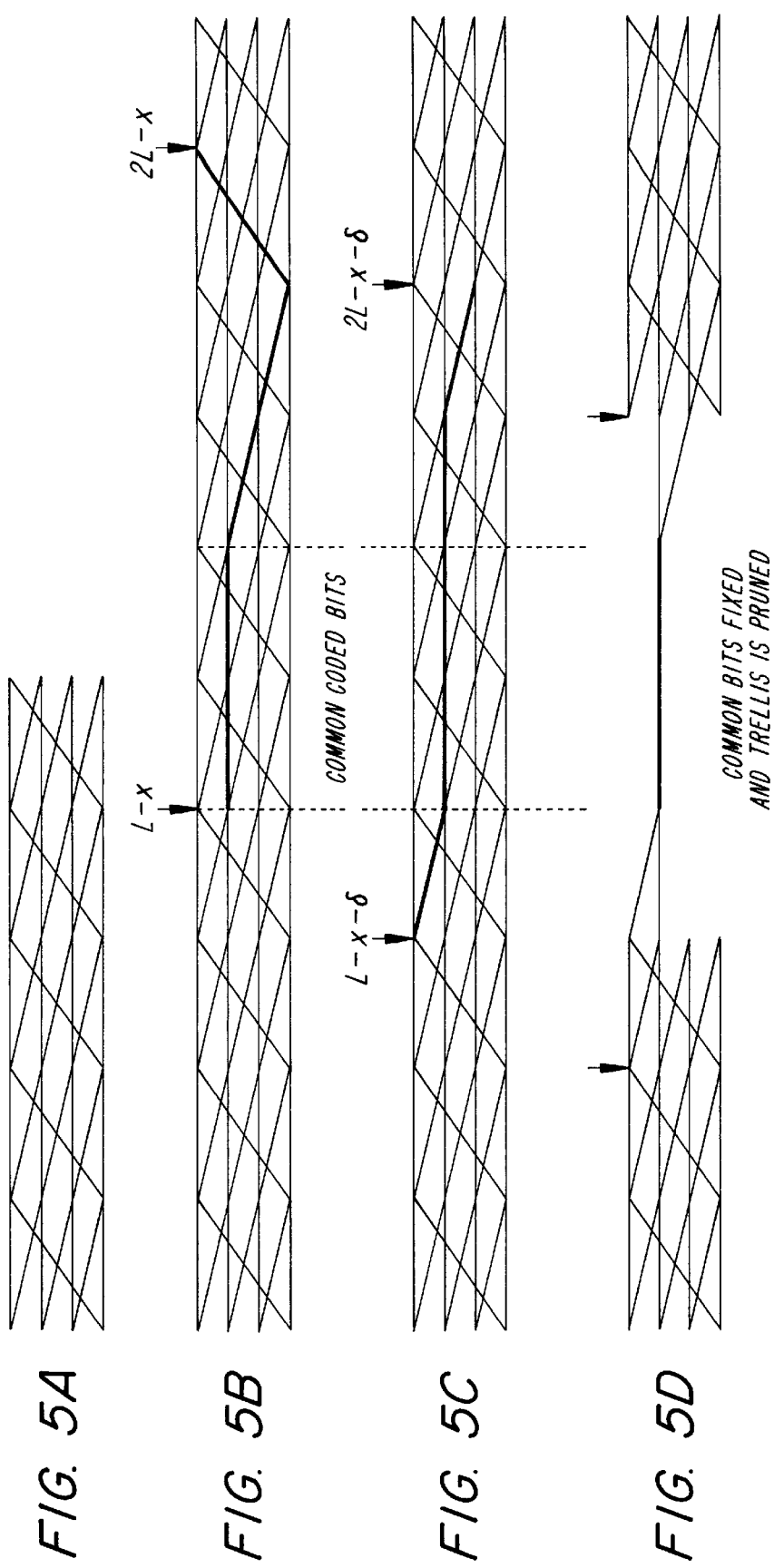

DECODING TECHNIQUE FOR TAIL BITING CODES

FIELD OF THE INVENTION

The present invention generally relates to decoding of encoded digital information; more particularly, the present invention relates to a technique for decoding digital information encoded with a tail biting code.

BACKGROUND OF THE INVENTION

A mobile phone in a terrestrial cellular system is more limited by cochannel interference (i.e., interference from other phones using the same carrier frequency at a distant cell), than by power considerations. Thus, a loss of 0.5 dB or even 1 dB in required transmitted energy-per-bit typically does not cause a noticeable degradation in voice (or data) quality. The basestation can transmit more power to the phone, and the phone can increase its power to the basestation. As a result, terrestrial systems can accommodate the overhead loss incurred in error control coding relatively easily.

Mobile satellite communications systems are, in contrast, severely power limited, and savings in required transmitted bit energy are highly desirable. GSM is currently the most widely deployed wireless cellular telephone standard for digital speech transmission. It has been adapted to provide wireless communication for Geostationary circular orbit satellites as well as via normal terrestrial cellular networks. It would be desirable to reduce the overhead in error control coding while maintaining good performance in a GSM-compatible mobile satellite system.

By way of background, a brief description of GSM principles will now be presented.

An exemplary GSM superframe structure consists of 4×26 frames as shown in FIG. 1A. Each row in FIG. 1A comprises 26 TDMA frames. In every row, frames 1–12 and 14–25 each contain eight traffic timeslots. TDMA frame 13 (the IDLE frame) is not used for transmission, but allows the mobile receiver to capture and decode a broadcast control channel (BCCH) signal burst from a neighboring base station. Since neighboring base stations in GSM are not required to be synchronized, the idle frame guarantees that the mobile can capture the BCCH regardless of the time offset between the neighboring base stations.

Every 26th frame in the superframe structure (the last column in FIG. 1A) contains Slow Associated Control Channel (SACCH) information. Each SACCH message is interleaved over the 4 SACCH bursts in each superframe. Each SACCH frame comprises 8 time slots (1 per traffic slot in each frame) allowing one unique SACCH channel per mobile link.

Each mobile unit is allocated 1 out of the 8 timeslots in each frame (its "channel"). Digitally coded voice data frames for a mobile unit are interleaved over 8 successive frames, maintaining the same time slot in every frame. Block diagonal interleaving can be used to reduce delay, whereby the first four time slots (in each 8 frame interleaving pattern) each comprise bits half from the current speech frame and half from the previous speech frame. The last four time slots (in each 8 frame interleaving pattern) each comprise bits half from the current speech frame and half from the next speech frame.

Speech frames are generated, e.g., every 20 mS, by the speech coder. With a speech coding rate of 13 Kbps this corresponds to 260 bits per 20 mS speech frame. The speech bits are coded up to 456 bits. In GSM, these 456 bits are divided into 8 groups of 57 bits each. 57 bits of one speech frame are interleaved with 57 bits of another speech frame (as described above for block diagonal interleaving). To these 114 bits is added a 26 bit sync word, two 1 bit FACCH (fast associated control channel) flags, two sets of 3 tail bits (for the modulation), and 8.25 bits to accommodate up/down ramping and guard time to form a TDMA slot (577 $\mu$S) comprising 156.25 bits. These bits are transmitted at a bit rate of 270.833 KB/s (=13 MHz/48).

The exemplary format of each GSM burst is shown in FIG. 1B. An 8.25-bit guard and up/down ramping time is provided between each burst. The up/down ramping of one burst may overlap with that of the adjacent burst but may not overlap with its other bits. The up/down ramping on the uplink (mobile) transmissions is usually 4.25 bit periods leaving a 4 bit period margin for time alignment error between different mobile bursts as received at the base station. The base station sends SACCH commands to advance or retard mobile unit transmit timing to accomplish this function. Base stations in a GSM system have a fixed transmit timing and hence can in principle use the whole 8.25 bit periods for up/down ramping.

The 3t (tail) bits allow the impulse response of the channel and modulation filter to terminate within the burst. It is important to receive the tails of the end bits to ensure the end bits are demodulated with the same error probability as bits in the middle of the burst.

The flag bits (1f+1f) on either side of the sync word indicate whether the previous or current 20 mS speech frame contains speech information or FACCH control information. One complete 20 mS speech frame typically has 8 associated flag bits in total, enabling a reliable majority decision to be made on whether the frame is speech or FACCH.

The sync word of 26 bits allows the coefficients of a symbol-spaced, 5-tap model of the composite channel impulse response (comprising transmit and receive filtering and physical channel) to be determined using 22 equations. Thus, each burst can be demodulated with no additional information from previous bursts. To accommodate frequency hopping, GSM assumes no correlation between the 5 channel taps of one burst and the taps of the next. The short burst length of 577 $\mu$S allows the assumption that the channel taps are static over the burst, i.e. the phase and amplitude of each tap as determined from the central sync word are still valid at the burst extremities even at speeds of 250 km/hour at 900 MHz or 100 km/hour at 2 GHz.

A full-rate GSM frame consists of 8 traffic bursts, of the format described above, multiplexed on the same carrier. Alternatively, the first slot of each frame (only one fixed carrier per cell) may be given to the broadcast control channel (BCCH). The BCCH slot does not frequency hop, but the other slots in the frame containing traffic may be frequency-hopped. Thus, the traffic slots on the same carrier as the BCCH may contain data from different mobiles from frame to frame. The BCCH carrier is left on at maximum power in all time slots whether or not the traffic slots contain active traffic. The traffic slots are filled with dummy traffic if idle. This assists mobiles in detecting the BCCH carrier when first powered-up.

Once detected, the BCCH slot format contains features to assist mobiles acquire network sync on power-up. BCCH slots in successive frames form a repeating 51-frame pattern. Each slot in this frame has a defined purpose. Two out of the 51 slots contain the FCH (Frequency Correction Burst) which is an "unmodulated" burst. More particularly, the FCH burst is an alternating "1010 . . . " bit pattern which, after the GSM modulation, produces a single spectral line which is offset from the carrier frequency by ¼ of the bitrate (i.e. a continuous MARK symbol in FSK parlance). This can be detected by a narrowband filter in the mobile to enhance signal-to-noise ratio by 10–15 dB allowing reliable instantaneous detection and providing coarse time sync with the BCCH slot structure. The synchronization channel (SCH) burst is a fixed number of slots away from the FCH, and hence once the FCH burst is located the mobile can find the SCH burst. The SCH burst contains an extended sync word plus the base station and network ID. Correlation with the SCH provides fine sync to the bit level. No sync finer than bit level is needed when using multiple channel tap demodulators.

The BCCH frame period of 51 is deliberately prime with respect to the traffic channel superframe period of 104 frames (4×26). The 51 frame period (multiframe) results in the BCCH slot sliding through 51×52 TDMA frames and guarantees that the FCH (and likewise the SCH) will appear sometime in the IDLE frame. This allows a mobile locked in conversation to the traffic superframe format to scan neighboring base stations using only the idle frames and in slow time to go through the normal sync acquisition process with them. The timing offset between current and neighboring bases is stored to expedite future scanning and eventual handover. Moreover, the 51×52 extended frame pattern length, plus other broadcast information, is used to define a frame numbering scheme employed in the ciphering process.

For satellite communications, the basic superframe format is similar to the GSM "half-rate" format in which a particular mobile uses only every alternate TDMA frame (8 slots), making effectively 16-slot frames of twice the length (9.23 mS). We refer to this as the full-rate satellite mode. A half-rate satellite mode can also be defined whereby a mobile uses only every 4th TDMA frame (8 slots) making effectively a 32-slot frame of length (18.46 ms).

The use of the 32-slot mode or the 16-slot mode depends on the traffic distribution and channel conditions.

The superframe structure for the full-rate satellite mode is shown in FIG. 2A. In FIG. 2A, the first 12 frames F1 through F12 contain 16 traffic slots each and the 13th frame contains 16 SACCH slots. Each SACCH slot is associated with a corresponding traffic slot. To preserve one SACCH per each traffic slot (now 16), the SACCH frame can be combined with the IDLE frame to make a 16-slot SACCH frame.

The SACCH messages, as in GSM, can be interleaved over four successive SACCH frames. 20 mS of speech data may be interleaved using diagonal interleaving, but over only 4 frames (the same interleaving delay). Alternatively, 40 mS speech frames may be diagonally interleaved over 8 traffic frames.

Satellite communication systems are severely power limited and bandwidth limited, requiring speech coding at bitrates of ½ to ⅓ those used in digital cellular. On the other hand, a noise-limited rather than the co-channel interference-limited situation justifies more error correction coding than a terrestrial cellular system, increasing the transmitted bitrate. Therefore a 16-slot format for a satellite communications system provides nominally the correct scaling of transmitted bits per user compared to a terrestrial cellular system.

However, a particular satellite system can be power or bandwidth limited or noise or self-interference limited. This varies from system to system or even from cell-to-cell within the same system. Therefore a 32-slot mode can also be defined which provides half the transmitted bitrate per user. This mode employs the same speech coding as the 16-slot mode with half as much error correction coding, or an even lower speech error correction coding rate or information rate. For purposes of explanation, it is assumed that the 32-slot mode uses the same speech coding rate and the same error correction coding. It also uses the same slot and superframe structure as the 16-slot structure defined in FIG. 2A, but only every alternate frame is transmitted. The unused frames may be allocated to other users, doubling bandwidth utilization in cells that are not limited by co-channel interference from surrounding cells.

The coding and interleaving employed in this example makes the use of 16 or 32-slot format completely transparent to the mobile or ground receivers, so that they do not need to be informed in advance of switching from one mode to the other by elaborate message exchange at layer 3.

Speech is coded to 4 kB/sec, then error-correction coded using a rate ⅓rd code composed of two rate ⅔rd codes of equal performance. One of the rate-⅔rd coded information streams (6 kB/sec) is transmitted on even frames (or not as the case may be) and the other stream, carrying the same information coded using the other rate ⅔rd code, is transmitted on odd frames (or not, as the case may be). The receiver always receives every frame, and determines from the sync correlation if the frame contains an intended burst or not. If another mobile is allocated the burst, the sync code used will be orthogonal to that of the first mobile to allow easy discrimination. If both even and odd frames contain intended data, the combined bits from both rate ⅔rd codes form a rate ⅓rd code with enhanced performance as well as twice the power. If only odd frames contain intended data, the even frames are erased and given no weight in the decoder, which then gives the performance of a single rate ⅔rd error correction code. If even frames sometimes contain intended data and sometimes not, depending on where after deinterleaving the bits appear in the input stream to the decoder, the performance will range between a rate ⅔rd code and a rate ⅓rd code.

There is only one 16-slot frame allocated to SACCH, therefore if operating in the 32-slot mode with 32 different mobile links, a SACCH frame is addressed to either the odd-frame mobile or the even-frame mobile by means of an odd/even bit in the message.

The satellite downlink can benefit from a reduction in the TDMA overhead. The number of sync bits is reduced from 26 to 22 while the FACCH flag bits are deleted. A reduced-overhead downlink satellite-mode slot format is shown in FIG. 2B. Due to the 16-slot format compared to GSM's 8-slot format, signal processing load in the phone is halved at least, allowing both the FACCH decoder and the speech frame decoder to be run on every frame. This also provides a much more reliable speech/FACCH decision, as determined from current product implementations. The speech decoder algorithm is first executed, and then the FACCH decoder is run in the time that GSM would normally be processing the next speech frame. The CRC's indicate whether the decoded output should be interpreted as speech or as FACCH information.

On the carrier that contains the Broadcast Control Channel (BCCH), the first slot of every 16-slot frame, including SACCH frames, is given to the BCCH channel. The BCCH structure as in the GSM case is composed of a 51-frame repeating pattern containing FCH, SCH, broadcast control channel (BCCH) and paging channels (PCH). The frame number in this structure (0–50), combined with the frame number (0–51) of the traffic superframe structure, defines the least significant part of a frame numbering scheme for ciphering purposes.

The significant differences between GSM BCCH and an exemplary satellite-mode BCCH will now be described. First, the carrier on which satellite-mode BCCH is transmitted is not necessarily active in all time slots. If no conversation is currently set up on a particular beam and carrier, only the BCCH slot may contain energy. Second, even when active traffic slots are contained in the same frame as a satellite-mode BCCH, they are not necessarily all at the same power level, due to a dynamic power control algorithm. The satellite BCCH slot can also be transmitted at a higher power than the mean of traffic bursts. Third, the FCH is not an unmodulated burst, but can be redefined as a High Margin Short Message Service (HM-SMS). More detail on such a short message service is provided in the copending, commonly assigned application entitled "High Power Short Message Service Using Broadcast Control Channel", the entirety of which is incorporated herein by reference. The SCH can also be used for the HM-SMS. Such an implementation provides 4 message bursts per 51 frames of HM-SMS capacity. The HM-SMS signal structure enables acquisition by mobile units in a highly disadvantaged location providing as much as 30 dB margin over an ideal, free-space, AWGN channel. Each HM-SMS burst contains one of a limited number of predetermined bit patterns resembling a long sync word, and are also transmitted at a higher power than the other 47 BCCH bursts. The HM-SMS bursts are therefore ideal for rapid initial system acquisition by mobiles in normal situations and fulfill the functions of the FCH and SCH. Fourth, the message content of the broadcast information on the satellite BCCH is different from that of GSM, although it contains some common parameters. The satellite BCCH will broadcast satellite-system related parameters for all satellites sufficient to allow the mobile to determine its position from the satellite signals.

A mobile phone is peak power limited due to the current drain from the battery. QMSK and $\pi$/QPSK have a peak to average envelope variation ranging between 3–4 dB. Further, they require a linear power amplifier that is at least 50% less efficient than a Class-C or quasi Class-C power amplifier that can be used with a constant envelope modulation. Thus, on the uplink constant envelope modulation such as GMSK is more power efficient. GMSK does not have high adjacent channel interference protection and thus requires additional signal processing at the satellite demodulator. On the downlink, since the spacecraft has a linear matrix power amplifier, linear modulation can be used to provide high adjacent channel interference protection without additional processing in the phone. Offset Quadrature Phase Shift Keying (OQPSK) can be used to allow demodulation with a GMSK compatible receiver such as in GSM.

Error control coding is commonly used in the transmission of digital information, and is particularly in mobile radio systems. For example, convolutional coding techniques with constraint lengths ranging from 5 to 7 are commonly used in American Digital Cellular and in GSM.

In conventional mobile radio systems, convolutional encoding is terminated by requiring a shift register encoder to start and end in a known state (e.g., all zeros). The shift register is first initialized by a first sequence of m zeros, where m is the number of memory elements in the encoder, followed by the information sequence. At the end of transmission a second sequence of m zeros is added to the end of the information sequence. The m zeros in the second sequence are called tail bits. Tail bits cause a power loss of $L/(L+m)$, where L is the block length of the information sequence. In terrestrial mobile systems, this power loss does not present a problem since such systems are not power limited.

Planned future global and regional satellite systems also propose the use of convolutional coding. Due to the power limitations of satellites, the tail bit loss (on the order of 0.5 dB) causes a substantial degradation in the system link margin.

To avoid tail bit loss, tail biting encoding can be used, in which the shift register encoder is initialized by the last m information bits, followed by the information sequence. In this case, the initial state and the final state are the same, just as in conventional convolutional coding. The problem of decoding such codes remains. Maximum likelihood decoding is too complex for convolutional or tail biting codes since a search over $2^m$ states is required to terminate the code.

As will be appreciated by those of ordinary skill in the art, a conventional convolutional encoder can be described by a trellis diagram. The length of the trellis L depends on how soon the convolutional code needs to be terminated. Decoding is then performed by finding the most likely path through the trellis, usually using the well-known Viterbi Algorithm. The path that has the best metric is chosen as the path traced by the transmitted sequence. It would be desirable to provide a reliable and relatively simple method for decoding convolutional and tail biting codes. It would further be desirable to provide a decoding method in which power consumption is reduced so that the method can be advantageously employed in a satellite or other power-limited telecommunications system.

SUMMARY OF THE INVENTION

In a decoder employing the method of the present invention, the decoding trellis is replicated and concatenated to the original trellis. According to an exemplary embodiment, the decoding trellis is duplicated to generate a trellis of length 2L, though the trellis may be modified for other multiples.

According to an exemplary embodiment, a decoder employing the method of the present invention receives encoded digital data; generates a replicated and concatenated decoding trellis; performs a first decoding of the decoding trellis by starting from an index point, determining a best state at the index point, and tracing back a best path, reordering the decoding results if necessary to compensate for a wraparound; storing the results of the first decoding in a suitable memory; performing one or more additional decodings, storing the results of each additional decoding in the memory, and comparing the stored result with the results of previous decodings to determine common information bits or symbols. According to further aspects of the present invention, majority logic can be used and/or an arbitrary decoding result can be selected for unresolved bits.

The present invention thus provides a simple, reliable, and efficient decoding method which is particularly advantageous for decoding information encoded with tail biting codes for transmission in a satellite telecommunications system.

BRIEF DESCRIPTION OF THE DRAWINGS

A more complete understanding of the invention can be obtained upon reading the following Detailed Description of the Preferred Embodiments in conjunction with the appended drawings, in which like reference indicia indicate like elements, and in which:

FIG. 3 is a block diagram of the elements of an exemplary communication system in which a decoder and method according to the present invention can be implemented;

FIGS. 5A–5D are trellis diagrams showing an exemplary decoding process according to the present invention.

DETAILED DESCRIPTION OF THE PREFERRED EMBODIMENTS

Figure 1A:
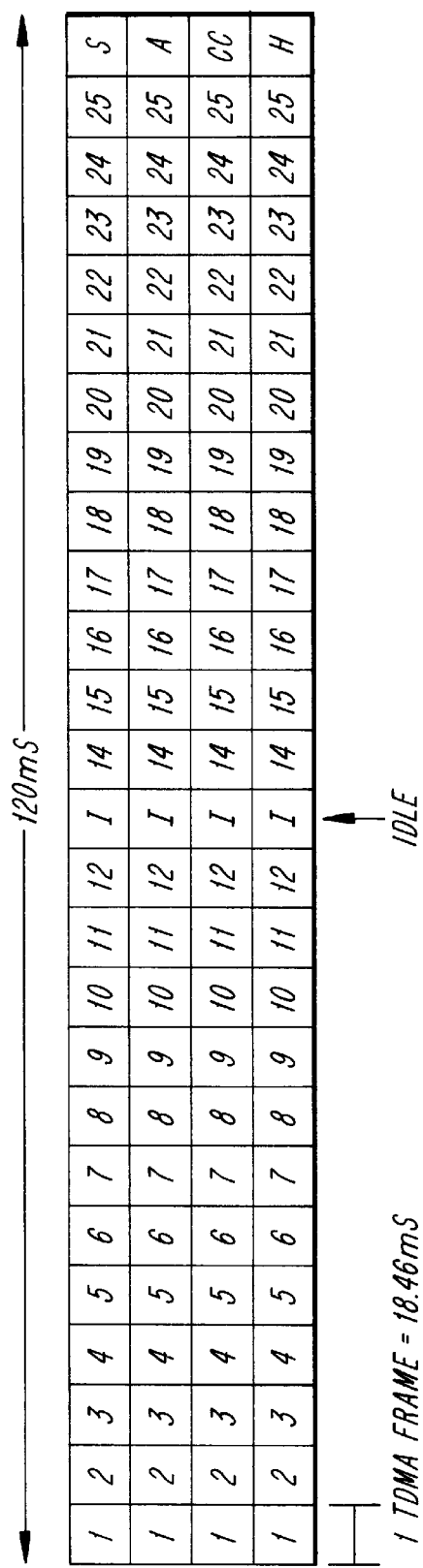
FIGS. 1A–B are diagrams of a GSM superframe and a typical GSM burst, respectively, for a terrestrial telecommunications system in which the present invention can be implemented.
Figure 1B:
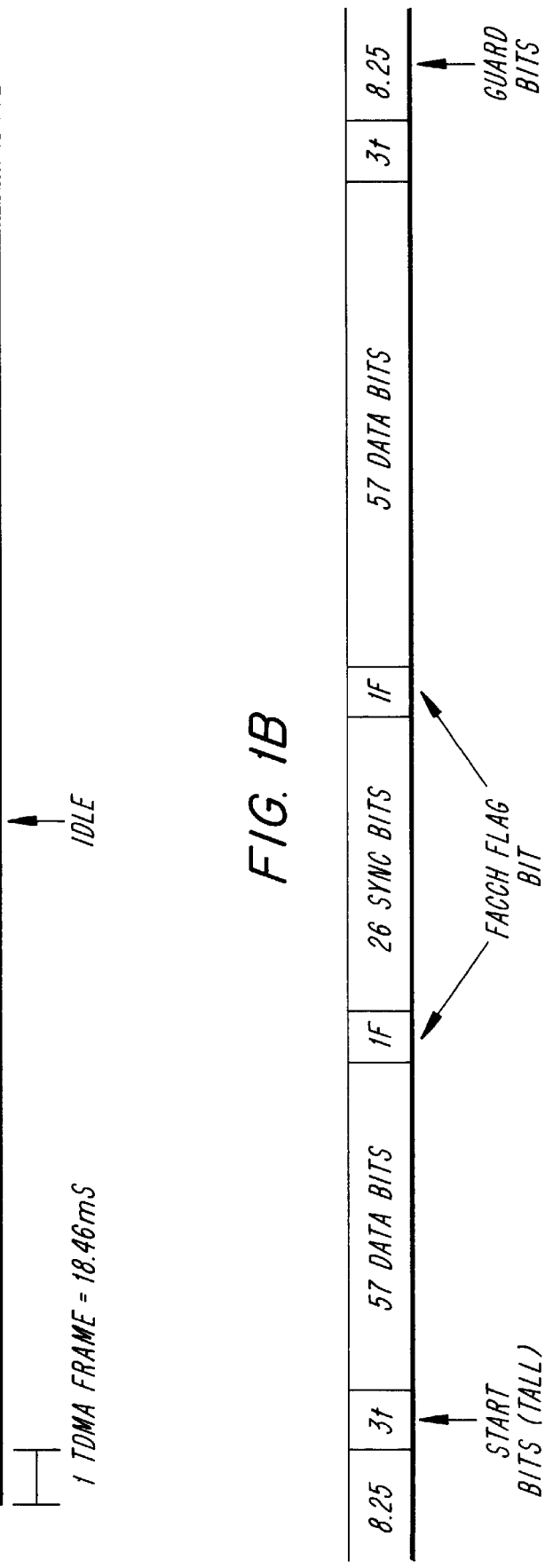
Figures 2A, 2B:
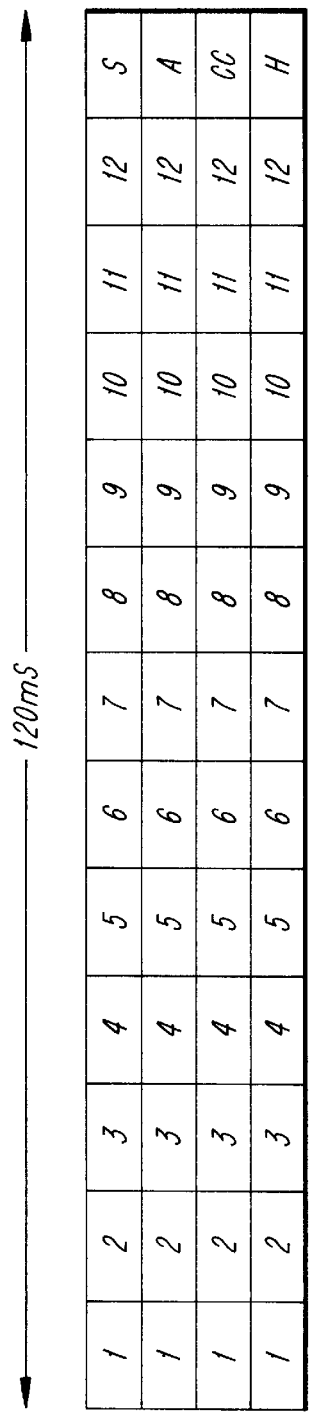
FIGS. 2A-B are diagrams of a superframe structure and a reduced-overhead downlink slot format, respectively, for a satellite telecommunications system in which the present invention can be implemented.

Referring now to FIG. 3, an exemplary communication system suitable for implementing the present invention is shown. Referring now to FIG. 1, an exemplary communication system for transmitting encoded digital communication signals, in which the method of the present invention can be implemented, is shown. The system includes a channel encoder 10 for encoding digital data bits or symbols to be transmitted, a modulator 12 for modulating the encoded data symbols and transmitting the symbols over a transmission channel 14 to a receiver, a demodulator 16 for detecting/demodulating the transmitted symbols at the receiver, and a decoder 18 for decoding the detected data symbols. The encoded, modulated symbols are preferably transmitted using time-division multiple access (TDMA), in which the symbols are transmitted in frames, each frame including multiple time slots. In a TDMA system, a communication channel is defined as one or more time slots in each frame which are assigned for use by a communicating transmitter and receiver. Each time slot contains numerous encoded bits or symbols. It will be appreciated that the present invention is applicable to other communication methods as well.

According to a first embodiment of the present invention, the decoder performs some number $D \leq D^{max}$ of passes through a replicated decoding trellis to generate preliminary decoded information sequences. The decoder then performs a pattern matching of the decoded information bits to determine a final output information sequence.

Figure 4:
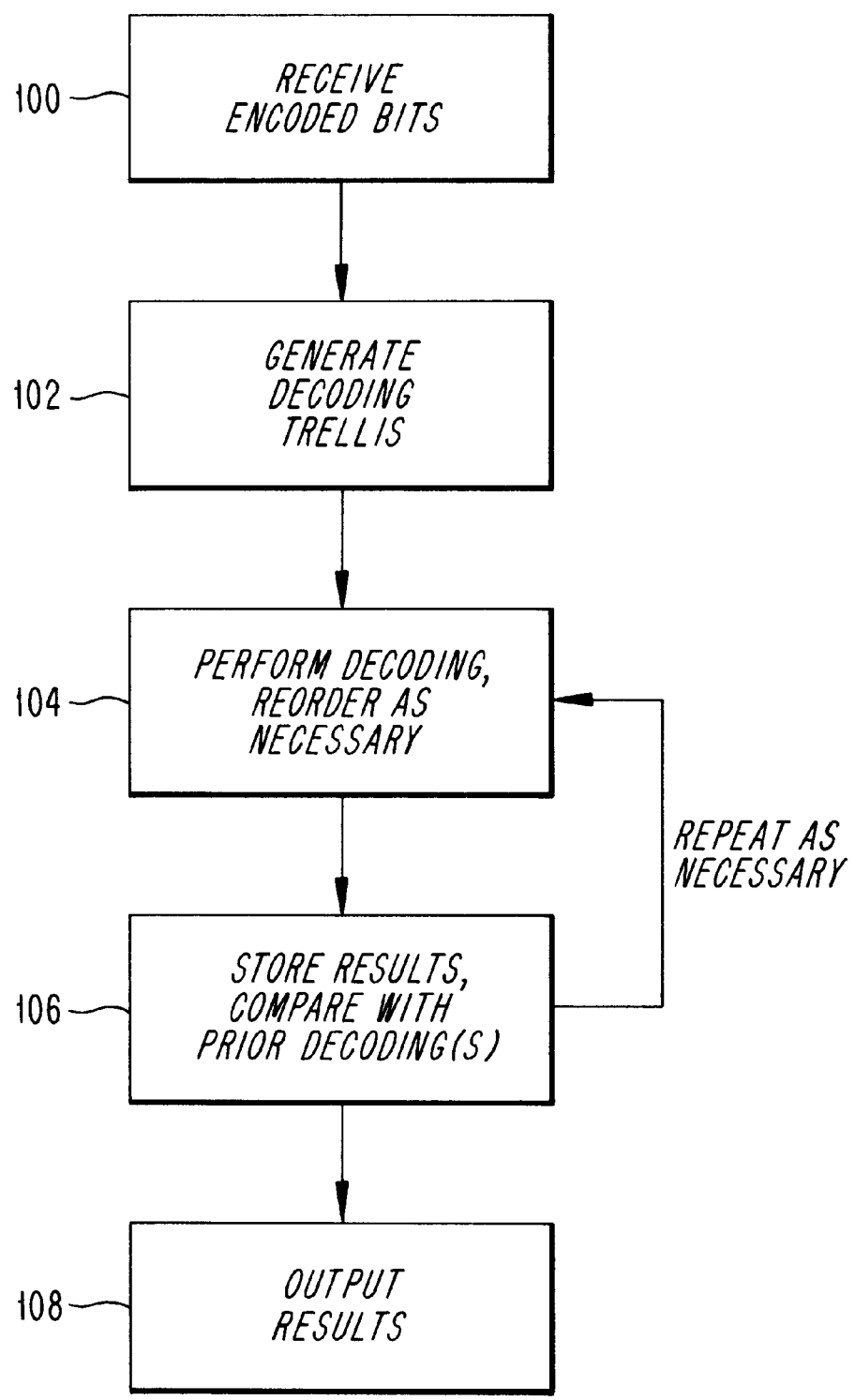
FIG. 4 is a flow chart describing an exemplary method according to the present invention.

Referring now to FIG. 4, a flow chart describing an exemplary embodiment of the present invention is shown. In step 100, the decoder receives encoded data, typically in blocks. Preferably, the encoded data is encoded with a convolutional code with tail biting. In step 102, the decoder generates a decoding trellis by replicating and concatenating an initial decoding trellis some rational number of times. Let L denote the length of a received vector. According to a preferred embodiment of the invention, the initial trellis is duplicated to form a trellis of length 2L. In step 104, a first pass $D^1$, starts from a first index point 2L-x. The decoder chooses the best state at the first index point, and traces back the best path of length L. The corresponding information bits are denoted $c_1^1, c_2^1, \ldots$, where each $c_j^i$ represents k consecutive bits. In step 106, the decoder stores this preliminary decoded information sequence in a suitable memory for future use.

The decoder repeats step 104, and performs a second pass $D^2$, starting from a second index point of, e.g., $2L-x-\delta$. The decoder then chooses the best state at the second index point and traces back the best path of length L. The decoder reorders the corresponding information bits to account for the wraparound, and denotes the reordered bits as $c_1^2$, $c_2^2, \ldots$. These results are stored in the suitable memory and compared with the results of the previous decoding. It is highly probable that parts of the first and second information sequences from $D^1$ and $D^2$ agree. These common bits can now assumed to be known and correctly decoded, and the trellis can be "pruned" appropriately. Such a pruning is shown in FIGS. 5A–D, where for simplicity x=1 and $\delta$=1. For purposes of explanation, it is assumed that $c_3^2=c_3^1$, $c_4^2=c_4^1$, and $c_8^2=c_8^1$.

The decoder can perform a third pass $D^3$, similar to $D^2$, from a third index point of, e.g., $2L-x-2\delta$. In the third pass, "known" locations (locations 3,4, and 8, in this example) are skipped. In this example, $c_1^3=c_1^2$ and $c_2^3=c_2^2$, so those bits are now fixed. As a result, for the fourth pass, only the bits at locations 5,6, and 7 remain unknown. The following table summarizes the results of this exemplary implementation.

| | | | | | | | | |
|---|---|---|---|---|---|---|---|---|
| $D^1$: | $c_1^1$ | $c_2^1$ | $c_3^1$ | $c_4^1$ | $c_5^1$ | $c_6^1$ | $c_7^1$ | $c_8^1$ |
| $D^2$: | $c_1^2$ | $c_2^2$ | $c_3^1$ | $c_4^1$ | $c_5^2$ | $c_6^2$ | $c_7^2$ | $c_8^1$ |
| $D^3$: | $c_1^2$ | $c_2^2$ | | | $c_5^3$ | $c_6^3$ | $c_7^3$ | |
| $D^4$: | | | | | $c_5^4$ | $c_6^4$ | $c_7^4$ | |

It will be appreciated that each successive decoding starts at an index point offset form the previous index point by a shift value $\delta$. The results of each decoding are compared with previous results to determine bits at each position in the trellis. Thus, the decoder repeats steps 104 and 106 some number of times. The decoder stops after all bits are determined, or after a predetermined maximum number $D^{max}$ of passes. If after $D^{max}$ passes, some bits are still unresolved, the decoder chooses one pass (e.g., the first pass) and determines its information bits as the unresolved bits. The decoder then outputs a final output information sequence in step 108.

According to an alternative embodiment, the decoder uses majority logic to decode the encoded information. As in the previous embodiment, the decoder performs $D^{max}$ passes, each shifted by shift value $\delta$ in the replicated trellis. The information bits of each pass are properly reordered as necessary to compensate for wraparound, and stored in a suitable memory. After the decoder completes $D^{max}$ passes, a majority logic rule is applied to the stored results on a bit-by-bit basis to output decoded information bits. It will be appreciated that if $D^{max}$ is even, ties are possible. The decoder can break such ties by arbitrarily choosing the unresolved bits of one of the passes (e.g., the first one). If $D^{max}$ is odd, there is no ambiguity.

While the foregoing description has included many details and specificities, it is to be understood that these are merely illustrative examples provided for purposes of explanation, and are not to be construed as limitations of the invention or the inventors' contributions to the art. Numerous modifications will be readily apparent to those of ordinary skill in the art which do not depart from the spirit and scope of the invention, as defined by the appended claims and their legal equivalents.

What is claimed is:

1. A method for decoding encoded digital communication signals, comprising:
   receiving encoded digital communication signals;

performing a first decoding of a decoding trellis generated from the received digital communication signals to generate a first decoded information sequence;

performing a second decoding of the decoding trellis to generate a second decoded information sequence;

comparing the second decoded information sequence with the first decoded information sequence to determine common information between the first and second decoded information sequences;

performing one or more subsequent decodings of the decoding trellis to generate one or more subsequent decoded information sequences, each subsequent decoding ignoring trellis locations containing common information;

comparing each subsequent decoded information sequence to portions of a previous decoded information sequence which does not contain common information; and outputting a final decoded information sequence including conmmon information generated from all decodings.

2. The method of claim 1, wherein the final decoded information further includes portions of a selected one of decoded information sequences.

3. The method of claim 2, wherein the selected decoded information sequence is the first decoded information sequence.

4. The method of claim 1, wherein the decoding trellis is of length nL, where n is a rational number, and is generated by duplicating and concatenating a first decoding trellis of length L.

5. The method of claim 4, wherein the first decoding is performed by starting from a first index point 2L−x in the decoding trellis, selecting a best state at the first index point 2L−x, and tracing back a best path of length L in the decoding trellis to generate the first decoded information sequence, wherein x is a specified value in said decoding trellis.

6. The method of claim 5, wherein the second decoding is performed by starting from a second index point 2L−x−δ, selecting a best state at the second index point 2L−x−δ, tracing back a best path of length L in the decoding trellis, and reordering information derived from the tracing back from the second index point to generate the second decoded information sequence, wherein δ is an upset value in said decoding trellis.

7. The method of claim 1, wherein the encoded digital communication signals are encoded with error control coding.

8. The method of claim 1, wherein each subsequent decoding is performed by starting from a subsequent index point offset by δ from a previous index point, wherein δ is an upset value in said decoding trellis.

9. The method of claim 1, wherein the final decoded information sequence further includes information derived from a majority logic operation of all portions of the decoding trellis not containing common information.

10. The method of claim 9, wherein the final decoded information sequence further includes portions of a selected one of decoded information sequences.

11. A communication system, comprising:

an encoder for encoding information signals with error control coding;

a modulator for modulating and transmitting encoded information signals; and a receiver for receiving and decoding the encoded information signals, the receiver including a convolutional decoder which generates a plurality of alternative decoded sequences and outputs subsets of the alternative decoded sequences as correct sequences if the subsets occur in more than one of the alternative decoded sequences.

12. The system of claim 11, wherein the error control coding is a convolutional code with tail biting.

13. The system of claim 11, wherein the decoder generates alternative sequences by forming a decoding trellis from the encoded information signals, performing a first decoding of the decoding trellis to generate a first decoded information sequence;

performing a second decoding of the decoding trellis to generate a second decoded information sequence;

comparing the second decoded information sequence with the first decoded information sequence to determine common subsets between the first decoded information sequence and the second decoded information sequence;

performing one or more subsequent decodings of the decoding trellis to generate one or more subsequent decoded information sequences;

comparing each subsequent decoded information sequence to portions of one or more previous decoded information sequences to determine additional common subsets; and outputting a final decoded information sequence including the common subsets generated from all decodings.

14. The system of claim 13, wherein the decoding trellis is of length nL, where n is a rational number, and is generated by replicating and concatenating a first decoding trellis of length L.

15. The method of claim 14, wherein the first decoding is performed by starting from a first index point 2L−x in the decoding trellis, selecting a best state at the first index point 2L−x, and tracing back a best path of length L in the decoding trellis to generate the first decoded information sequence, wherein x is a specified value in said decoding trellis.

16. The method of claim 15, wherein the second decoding is performed by starting from a second index point 2L−x−δ, selecting a best state at the second index point 2L−x−δ, tracing back a best path of length L in the decoding trellis, and reordering information derived from the tracing back from the second index point to generate the second decoded information sequence, wherein δ is an upset value in said decoding trellis.

17. The method of claim 14, wherein each subsequent decoding is performed by starting from a subsequent index point offset by δ from a previous index point, wherein δ is an upset value in said decoding trellis.

18. The system of claim 11, wherein each of the subsets is of a predetermined length.

19. The system of claim 13, wherein the decoder further outputs portions of a selected one of the alternative decoded sequences.

20. The system of claim 19, wherein the selected one is the first decoded information sequence.

21. A decoder for decoding encoded digital communication signals, comprising:

means for receiving encoded digital communication signals;

means for performing a first decoding of a decoding trellis generated from the received digital communication signals to generate a first decoded information sequence;

means for performing a second decoding of the decoding trellis to generate a second decoded information sequence;

means for comparing the second decoded information sequence with the first decoded information sequence to determine common information between the first and second decoded information sequences;

means for performing one or more subsequent decodings of the decoding trellis to generate one or more subsequent decoded information sequences, each subsequent decoding ignoring trellis locations containing common information;

means for comparing each subsequent decoded information sequence to portions of a previous decoded information sequence which does not contain common information; and means for outputting a final decoded information sequence including common information generated from all decodings.

22. A method for decoding encoded digital communication signals, comprising the steps of:

receiving encoded digital communication signals;

performing a predetermined number of decodings of a decoding trellis generated from the received digital communication signals to generate a predetermined number of decoded information sequences, wherein the decoding trellis is of length nL, and is formed by replicating and concatenating a rational number n of first decoding trellises of length L: and determining an output decoded information sequence from a majority logic calculation performed for each sequence position of the predetermined number of decoded information sequences.

23. The method of claim 22, wherein the output decoded information sequence further includes, for each sequence position in which the majority logic calculation fails, items from a selected one of the predetermined number of decoded information sequences.

24. The method of claim 22, wherein the encoded digital communication signals are received in blocks.

25. A method for decoding encoded digital communication signals, comprising the steps of:

receiving encoded digital communication signals; and performing a predetermined number of decodings of a decoding trellis generated from the received digital communication signals to generate a predetermined number of decoded information sequences, wherein the decoding trellis is of length nL, and is formed by replicating and concatenating a rational number n of first decoding trellises of length L.

* * * * *